US009256246B1

(12) United States Patent
Lim et al.

(10) Patent No.: US 9,256,246 B1
(45) Date of Patent: Feb. 9, 2016

(54) CLOCK SKEW COMPENSATION WITH ADAPTIVE BODY BIASING IN THREE-DIMENSIONAL (3D) INTEGRATED CIRCUITS (ICS) (3DICS)

(71) Applicant: QUALCOMM Incorporated, San Diego, CA (US)

(72) Inventors: Sung Kyu Lim, Duluth, GA (US); Yang Du, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/608,462

(22) Filed: Jan. 29, 2015

(51) Int. Cl.
*H03H 11/26* (2006.01)
*H03K 5/12* (2006.01)
*G06F 1/10* (2006.01)
*H03K 5/135* (2006.01)
*H03K 5/00* (2006.01)

(52) U.S. Cl.
CPC *G06F 1/10* (2013.01); *H03K 5/135* (2013.01); *H03K 2005/00019* (2013.01)

(58) Field of Classification Search
USPC .................. 327/164–180, 291–299, 374; 326/93–98
See application file for complete search history.

(56) References Cited

U.S. PATENT DOCUMENTS

| 6,127,880 | A * | 10/2000 | Holst | G11C 29/02 327/399 |
| 6,255,884 | B1 * | 7/2001 | Lewyn | G06F 1/10 327/293 |
| 6,583,659 | B1 * | 6/2003 | Kwong | G06F 1/10 326/86 |
| 7,015,741 | B2 | 3/2006 | Tschanz et al. | |
| 7,616,043 | B2 * | 11/2009 | Takano | H03K 19/0016 327/293 |
| 8,040,155 | B2 | 10/2011 | Tran Vo et al. | |
| 2003/0163750 | A1 * | 8/2003 | Trivedi | H03K 5/15013 713/503 |
| 2006/0033544 | A1 * | 2/2006 | Hui | H03K 3/0315 327/276 |
| 2007/0063751 | A1 * | 3/2007 | Kanda | H03K 5/02 327/175 |
| 2007/0063756 | A1 * | 3/2007 | Takano | G06F 1/10 327/291 |
| 2007/0216464 | A1 * | 9/2007 | Roche | G06F 1/10 327/295 |
| 2008/0115004 | A1 | 5/2008 | Braun et al. | |

(Continued)

OTHER PUBLICATIONS

Chae, K. et al., "Tier Adaptive Body Biasing: A Post-Silicon Tuning Method to Minimize Clock Skew Variations in 3-D ICs," IEEE Transactions on Components, Packaging and Manufacturing Technology, vol. 3, No. 10, Oct. 2013, IEEE, pp. 1720-1730.

(Continued)

*Primary Examiner* — Brandon S Cole
(74) *Attorney, Agent, or Firm* — Withrow & Terranova, PLLC (57) ABSTRACT

Clock skew compensation with adaptive body biasing in three-dimensional (3D) integrated circuits (ICs) (3DICs) is disclosed. In one aspect, a sensor is placed on each tier of a 3DIC to evaluate a speed characteristic of each tier relative to the speed characteristic of another tier. Based on determining the relative speed characteristics, a control signal may be provided to adjust back body bias elements for clock buffers. Adjusting the back body bias effectively adjusts a threshold voltage of the clock buffers. Adjusting the threshold voltage of the clock buffers has the effect of slowing down or speeding up the clock buffers. For example, slow clock buffers may be sped up by providing a forward body bias and fast clock buffers may be slowed down by providing a reverse body bias. By speeding up slow elements and slowing down fast elements, compensation for the relative speed characteristics may be provided.

25 Claims, 8 Drawing Sheets

(56) References Cited

U.S. PATENT DOCUMENTS

| | | | |
|---|---|---|---|
| 2010/0237914 A1* | 9/2010 | Katoh | G06F 1/10 327/149 |
| 2014/0225218 A1 | 8/2014 | Du | |
| 2014/0225235 A1 | 8/2014 | Du | |
| 2014/0240021 A1* | 8/2014 | Hibbeler | G06F 17/5068 327/297 |
| 2014/0253196 A1* | 9/2014 | Du | H01L 27/0688 327/202 |

OTHER PUBLICATIONS

Panth, S. et al., "High-Density Integration of Functional Modules Using Monolithic 3D-IC Technology," 2013 18th Asia and South Pacific Design Automation Conference (ASP-DAC), Jan. 22-25, 2013, Yokohama, Japan, IEEE, pp. 681-686.
Co-pending U.S. Appl. No. 14/159,028, filed Jan. 20, 2014.
Co-pending U.S. Appl. No. 14/272,981, filed May 8, 2014.

* cited by examiner

CLOCK SKEW COMPENSATION WITH ADAPTIVE BODY BIASING IN THREE-DIMENSIONAL (3D) INTEGRATED CIRCUITS (ICS) (3DICS)

BACKGROUND

I. Field of the Disclosure

The technology of the disclosure relates generally to clock trees in integrated circuits.

II. Background

Mobile communications devices have become common in current society. The prevalence of these mobile devices is driven in part by the many functions that are now enabled on such devices. Demand for such functions increases processing capability requirements and generates a need for more powerful batteries. Within the limited space of the housing of the mobile communications device, batteries compete with the processing circuitry. The limited space contributes pressure to continued miniaturization of components. Likewise, the limited space available for batteries contributes pressure to reduce power consumption by the circuitry. While miniaturization and power consumption have been of particular concern in the integrated circuits (ICs) of mobile communications devices, other ICs have also been impacted.

Historically, elements within an IC have all been placed in a single two-dimensional (2D) active layer with elements interconnected through one or more metal layers that are also within the IC. For more complex circuit requirements, multiple ICs are interconnected through conductors on a printed circuit board. While such circuits have generally become smaller according to Moore's Law, efforts to miniaturize ICs are reaching their limits in a 2D space and thus, design thoughts have moved to three dimensions. While there have been efforts to connect two or more ICs through a separate set of metal layers outside the IC proper, that solution is not properly a three-dimensional (3D) approach. Likewise, two IC chips have been stacked one atop of another with connections made between the two IC chips through solder bumps (i.e., the so called "flip chip" format). Likewise, there are system in package (SiP) solutions that stack IC chips atop of one another with connections made between the chips with through silicon vias (TSVs). While arguably the flip chip and TSV aspects represent 3D solutions, the amount of space required to effectuate a flip chip remains large. Likewise, the space required to implement a TSV relative to the overall size of the chip becomes space prohibitive if many TSVs are required. The best 3D solution to date is seen in the evolution of monolithic three-dimensional ICs (3DICs).

The advent of monolithic 3DICs has provided a number of interesting possibilities in circuit design, but creates its own design issues especially as it relates to clock management. Of particular concern is clock skew, which is the time difference in the arrival of an edge of a clock signal at two different elements that rely on the clock signal (e.g., a latch or flop). Clock skew is of concern because it reduces the effective clock period available for computation. In 2D designs, clock skew arises primarily from delay created by intervening conductive paths of different lengths. Some clock skew may arise from process variations between elements. Additional clock skew may result from clock uncertainty. While an annoyance in a 2D design, such annoyances are exacerbated into legitimate problems in a 3D design. Not only may there be process variations within a single tier, there may be process variations between different dies or different tiers. Likewise, the conductive paths may have dramatically different lengths between tiers (e.g., paths on the tier with the clock source may be substantially shorter than paths that extend to another tier). Accordingly, there is a need to provide clock management regimes in 3DICs.

SUMMARY OF THE DISCLOSURE

Aspects disclosed in the detailed description include clock skew compensation with adaptive body biasing in three-dimensional (3D) integrated circuits (ICs) (3DICs). In exemplary aspects, a sensor is placed on each tier of a 3DIC to evaluate a speed characteristic of the tier relative to the speed characteristic of another tier. Such different speed characteristics contribute to clock skew, and compensating for such differing speed characteristics may help reduce or eliminate clock skew caused by process variations between different tiers. Thus, based on determining the relative speed characteristics, a control signal may be provided to adjust back body bias elements for the clock buffers. Adjusting the back body bias effectively adjusts the threshold voltage of the clock buffers. Adjusting the threshold voltage of the clock buffers has the effect of slowing down or speeding up the clock buffers. For example, slow clock buffers may be sped up by providing a forward body bias and fast clock buffers may be slowed down by providing a reverse body bias. By speeding up slow elements and slowing down fast elements, compensation for the relative speed characteristics may be provided.

In this regard in one aspect, a 3DIC is disclosed. The 3DIC comprises a first tier having a first speed characteristic. The first tier comprises one or more first clock buffers served by a first portion of a clock tree. The first tier also comprises a first sensor configured to detect the first speed characteristic for both n-type and p-type clock buffers in the first tier and generate a first output indicative of the first speed characteristic. The first tier also comprises a first skew compensator configured to provide a first adjusted delay for at least one of the one or more first clock buffers based on the first output indicative of the first speed characteristic and not adjusting non-clock buffers in the first tier. The 3DIC also comprises a second tier having a second speed characteristic. The second tier comprises one or more second clock buffers served by a second portion of the clock tree. The second tier also comprises a second sensor configured to detect the second speed characteristic for both n-type and p-type clock buffers in the second tier and generate a second output indicative of the second speed characteristic. The second tier also comprises a second skew compensator configured to provide a second adjusted delay for at least one of the one or more second clock buffers based on the second output indicative of the second speed characteristic and not adjusting non-clock buffers in the second tier.

In another aspect, a 3DIC is disclosed. The 3DIC comprises a first tier having a first speed characteristic. The first tier comprises one or more first clock buffers served by a first portion of a clock tree. The first tier also comprises a first means for sensing configured to detect the first speed characteristic for both n-type and p-type clock buffers in the first tier and generate a first output indicative of the first speed characteristic. The first tier also comprises a first means for compensating skew configured to provide a first adjusted delay for at least one of the one or more first clock buffers based on the first output indicative of the first speed characteristic and not adjusting non-clock buffers in the first tier. The 3DIC also comprises a second tier having a second speed characteristic. The second tier comprises one or more second clock buffers served by a second portion of the clock tree. The second tier also comprises a second means for sensing configured to detect the second speed characteristic for both n-type and p-type clock buffers in the second tier and generate a second output indicative of the second speed characteristic. The second tier also comprises a second means for compensating skew configured to provide a second adjusted delay for at least one of the one or more second clock buffers based on the second output indicative of the second speed characteristic and not adjusting non-clock buffers in the second tier.

In another aspect, a method is disclosed. The method comprises sensing a first speed characteristic for both n-type and p-type first clock buffers on a first tier of a 3DIC. The method also comprises generating a first output indicative of the first speed characteristic. The method also comprises providing a first adjusted delay for at least one of the n-type and p-type first clock buffers based on the first output and not adjusting non-clock buffers in the first tier. The method also comprises sensing a second speed characteristic for both n-type and p-type second clock buffers on a second tier of the 3DIC. The method also comprises generating a second output indicative of the second speed characteristic. The method also comprises providing a second adjusted delay for at least one of the n-type and p-type second clock buffers based on the second output and not adjusting non-clock buffers in the second tier.

In another aspect, a 3DIC is disclosed. The 3DIC comprises a first tier having a first speed characteristic. The first tier comprises one or more first clock buffers served by a first portion of a clock tree. The first tier also comprises a first sensor configured to detect the first speed characteristic for both n-type and p-type clock buffers in the first tier and generate a first output indicative of the first speed characteristic. The first tier also comprises a first skew compensator configured to provide a first adjusted delay for at least one of the one or more first clock buffers based on the first output indicative of the first speed characteristic and not adjusting non-clock buffers in the first tier. The 3DIC also comprises a second tier having a second speed characteristic. The second tier comprises one or more second clock buffers served by a second portion of the clock tree. The second tier also comprises a second sensor configured to detect the second speed characteristic for both n-type and p-type clock buffers in the second tier and generate a second output indicative of the second speed characteristic. The second tier also comprises a second skew compensator configured to provide a second adjusted delay for at least one of the one or more second clock buffers based on the second output indicative of the second speed characteristic.

DETAILED DESCRIPTION

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include clock skew compensation with adaptive body biasing in three-dimensional (3D) integrated circuits (ICs) (3DICs). In exemplary aspects, a sensor is placed on each tier of a 3DIC to evaluate a speed characteristic of the tier relative to the speed characteristic of another tier. Such different speed characteristics contribute to clock skew, and compensating for such differing speed characteristics may help reduce or eliminate clock skew caused by process variations between different tiers. Thus, based on determining the relative speed characteristics, a control signal may be provided to adjust back body bias elements for the clock buffers. Adjusting the back body bias effectively adjusts the threshold voltage of the clock buffers. Adjusting the threshold voltage of the clock buffers has the effect of slowing down or speeding up the clock buffers. For example, slow clock buffers may be sped up by providing a forward body bias and fast clock buffers may be slowed down by providing a reverse body bias. By speeding up slow elements and slowing down fast elements, compensation for the relative speed characteristics may be provided.

Figure 1:
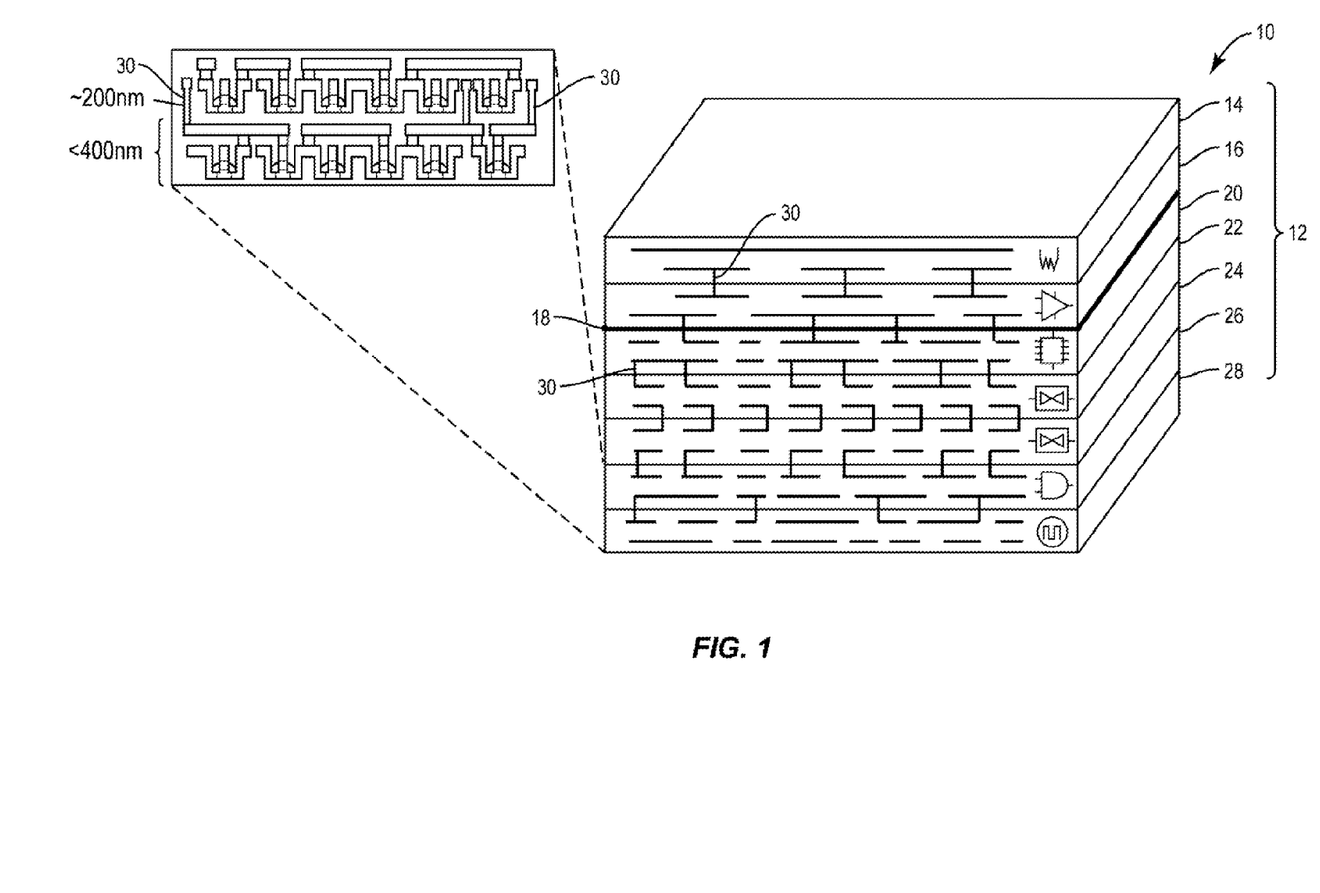
FIG. 1 is a block diagram of an exemplary three-dimensional (3D) integrated circuit (IC) (3DIC) that may have clocked elements such as clock buffers within multiple tiers.
Figure 2:
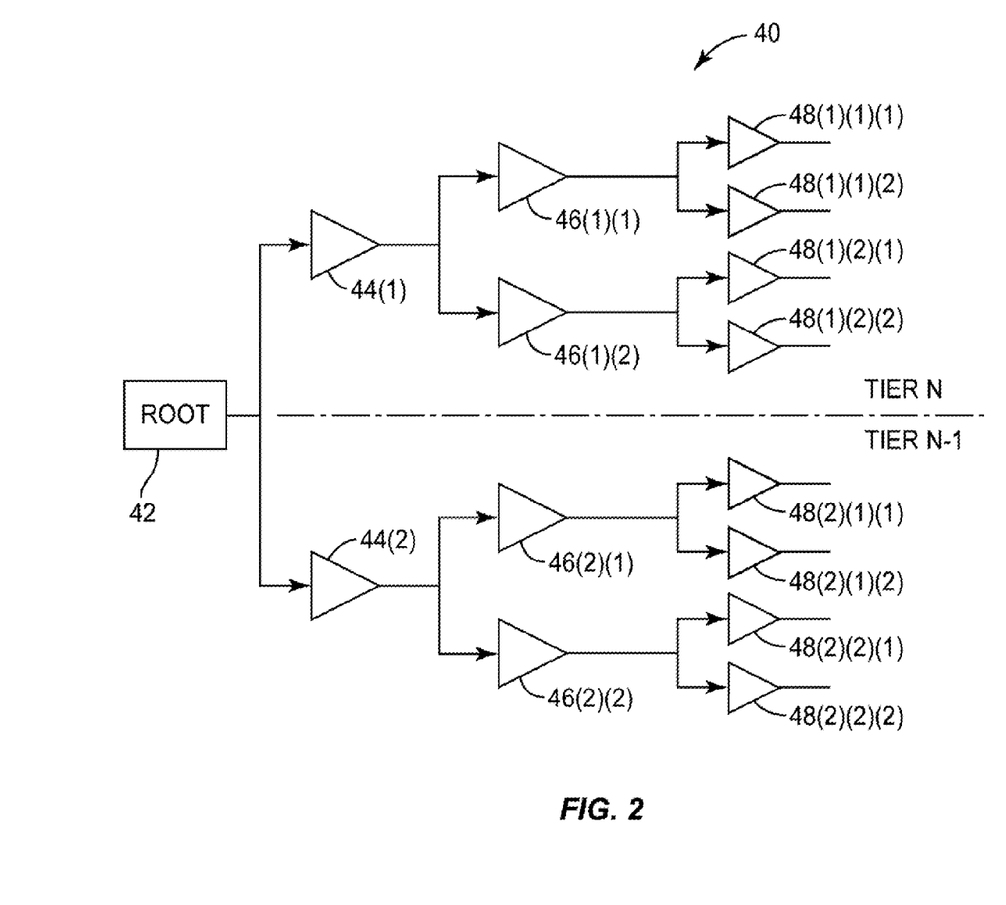
FIG. 2 is a simplified clock tree associated with the 3DIC of FIG. 1.
Figure 3:
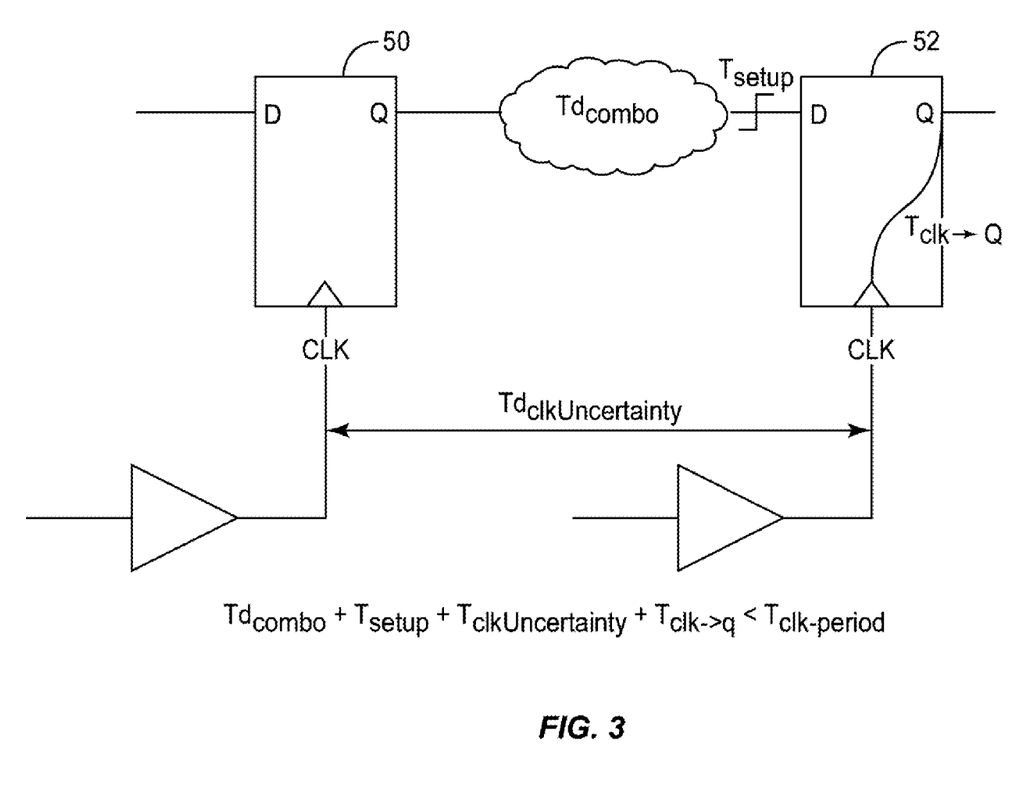
FIG. 3 is a simplified schematic of elements within a clock tree that illustrates sources of delay within the clock tree.

Before addressing the particulars of a clock skew compensation with adaptive body biasing of the present disclosure, a brief overview of a 3DIC is provided with reference to FIG. 1 along with a discussion of clock trees in such a 3DIC, and sources of delay within such clock trees with reference to FIGS. 1-3. Discussion of cross-tier clock skew management systems begins with reference to FIG. 4 below. While FIGS. 1-3 focus on monolithic 3DIC, the present disclosure is not so limited and other 3DICs may also benefit from aspects disclosed herein.

In this regard, FIG. 1 illustrates a simplified cross-section of a 3DIC 10. The 3DIC 10 has multiple tiers 12. The tiers 12 may be formed by hydrogen cutting or other monolithic tier formation methods. For more information on an exemplary hydrogen cutting process, the interested reader is referred to U.S. Patent Application Publication Number 2014/0225218, filed Feb. 12, 2013, which is herein incorporated by reference in its entirety. Alternatively, the 3DIC 10 may not be a true monolithic 3DIC, but could be a flip-chip style 3DIC or a die-to-die with through silicon via (TSV) style 3DIC.

The use of 3DIC technology allows different tiers of the tiers 12 within the 3DIC 10 to perform different functions and provide all the functions of a particular device in a single 3DIC 10. For example, the 3DIC 10 may be a radio frequency (RF) transceiver and controller for a mobile terminal. Thus, a first tier 14 includes sensors and other large feature size elements.

With continued reference to FIG. 1, a second tier 16 may include radio frequency, analog and/or power management integrated circuit (PMIC) components, such as a receiver, transmitter, and duplexer/switch. The second tier 16 may be designed to be relatively low noise so that incoming RF analog signals are not distorted.

With continued reference to FIG. 1, an electromagnetic (EM) shield 18 may be positioned between the second tier 16 and a third tier 20. The EM shield 18 may be formed from a conductive material, such as a graphene layer. For more information about graphene shields in 3DICs, the interested reader is referred to U.S. Patent Application Publication Number 2014/0225235, filed Feb. 12, 2013, the disclosure of which is herein incorporated by reference in its entirety.

The presence of the EM shield 18 helps prevent noise from the first and second tiers 14, 16 from affecting the low noise characteristics of the third tier 20. The third tier 20 may have a modem or other controller. To accommodate the functions on the third tier 20, the materials and design of the third tier 20 may be selected to promote a medium speed architecture.

With continued reference to FIG. 1, fourth and fifth tiers 22, 24 may be a memory bitcell array with random access memory (RAM) including dynamic RAM (DRAM), static RAM (SRAM) or the like. Both tiers 22, 24 may be designed to provide low leakage circuitry to improve the operation of the RAM.

With continued reference to FIG. 1, sixth and seventh tiers 26, 28 may be general processing unit tiers. The sixth tier 26 may include a digital signal processor (DSP), such as a baseband processor using combination logic, while the seventh tier 28 may include a digital signal processor (DSP) relying on sequential logic. Both of the sixth and seventh tiers 26, 28 may be designed to support high speeds over concerns about leakage.

In an exemplary aspect, the tiers 12 are electrically intercoupled by monolithic intertier vias (MIVs) 30. For more information about MIV, the interested reader is referred to "High-Density Integration of Functional Modules Using Monolithic 3D-IC Technology" by Shreedpad Panth et al. in the proceedings of the IEEE/ACM Asia South Pacific Design Automation Conference, 2013; pp. 681-686, which is hereby incorporated by reference in its entirety. In contrast to TSV, MIV may be on the order of sub 100 nanometer (nm) in diameter (i.e., much smaller than the micron dimensions of the TSV) and be 200 nm or less in depth. Further, in an exemplary aspect, each of the multiple tiers 12 may be approximately 400 nm thick or thinner. These dimensions are illustrated in the inset of FIG. 1. While the MIVs 30 are suitably small, other exemplary aspects may use TSV for inter-tier connections.

As is understood, there may be numerous elements within the 3DIC 10 that require clock signals. These elements may be on any of the tiers 12 of the 3DIC 10. While an asynchronous clock structure is possible where there are separate clocks on each tier 12, such an architecture is not an efficient utilization of space within the 3DIC 10 and sharply limits the utility of the 3DIC 10 to implementations that do not require synchronous processing. Accordingly, a single clock may generate a single clock signal that is routed to the various elements within the 3DIC 10. The routing of the clock signal may be abstracted from the actual conductive paths as a clock tree.

In this regard, FIG. 2 is a depiction of such an abstract clock tree 40 for the 3DIC 10 of FIG. 1. A root 42 is the clock source, which in an exemplary aspect, may be a phase-locked loop (PLL), as is well understood. As the clock signal passes through elements, the clock signal may be split, repeated, amplified, regenerated, or otherwise processed, as is well understood. As illustrated, the signal from the root 42 is split between two first generation elements 44(1) and 44(2). The signals from first generation elements 44(1) and 44(2) are split and provided to second generation elements 46(1)(1), 46(1)(2) and 46(2)(1), 46(2)(2). The signals are split from the second generation elements 46(1)(1), 46(1)(2) and 46(2)(1), 46(2)(2) into third generation elements 48(1)(1)(1), 48(1)(1)(2) ... and so on up to 48(2)(2)(2).

It should be appreciated that FIG. 2 is a very simplified version of a clock tree with symmetrical splits on the branches and identical leaves. In reality, the paths (branches) to the various leaves of the clock tree may be of different length and/or have different numbers of elements between the root (e.g., the root 42) and the leaf (e.g., the third generation elements 48). Thus, the delay between various elements of the clock tree 40 may vary. Furthermore, there may be process variations that arise between different elements. While a certain amount of process variation exists within a single tier of active components, even greater process variations may exist between elements on different tiers 12 of the 3DIC 10 of FIG. 1. Such process variations are sometimes referred to as a clock uncertainty factor ($T_{clkUncertainty}$). In some instances, a particular tier 12 may be designed to be faster or slower than other tiers 12 (e.g., tiers 26, 28 are high speed tiers compared to third tier 20 being a medium speed).

Whether by design or by circumstance, differences in the arrival times of the clock signal at the various clocked elements may result in unacceptable clock skew. As described above, clock skew is the time difference in the arrival of an edge of a clock signal at two different elements that rely on the clock signal (e.g., a latch or flop). Clock skew is of concern because it reduces the effective clock period available for computation. In 2D designs, clock skew arises primarily from delay created by intervening conductive paths of different lengths. Some clock skew may arise from process variations between elements. Additional clock skew may result from clock uncertainty. While an annoyance in a 2D design, such annoyances are exacerbated into legitimate problems in a 3D design. Not only may there be process variations within a single tier, there may be process variations between different dies or different tiers. Likewise, the conductive paths may have dramatically different lengths between tiers (e.g., paths on the tier with the clock source may be substantially shorter than paths that extend to another tier). FIG. 3 provides a simplified schematic that summarizes the sources of delay between different elements within a clock tree that may generate clock skew. That is, a clock signal (CLK) arrives at a first element 50 and a second element 52, which, in an exemplary aspect, are both flip-flops. The data signal at the input of the first element 50 will eventually pass through to the input of the second element 52 through a combinatorial cloud. For this data to be captured correctly at the output of the second element 52, the data needs to arrive at the input of the second element 52 within a setup time window. This arrival constraint generates the simple mathematical constraint of $Td_{combo}+T_{setup}+T_{clkUncertainty}+T_{clk \to Q} < T_{clk\text{-}period}$; where $Td_{combo}$ is the signal delay through the combinatorial cloud, $T_{setup}$ is the flip-flop setup time of the second element 52, $T_{clk \to q}$ is the clock to Q delay of the second element 52 clock input to data output delay, and $T_{clk\_uncertainty}$ is the uncertainty between the clock arrival time between the two elements 50 and 52.

While the $T_{clk\_uncertainty}$ associated with a single tier cannot be reduced to zero due to local variation, the added uncertainty due to the global variation between the two tiers or dies can be addressed by speeding up and/or slowing down clock buffers. Exemplary aspects of the present disclosure provide such acceleration or throttling through the use of a skew compensator in the form of back body biasing the clock buffers. By speeding up slow portions and slowing down fast portions, the difference in clock arrival time (i.e., skew) is reduced to a tolerable level. More detail about back body biasing may be found below with reference to FIGS. 6 and 7.

Figure 4:
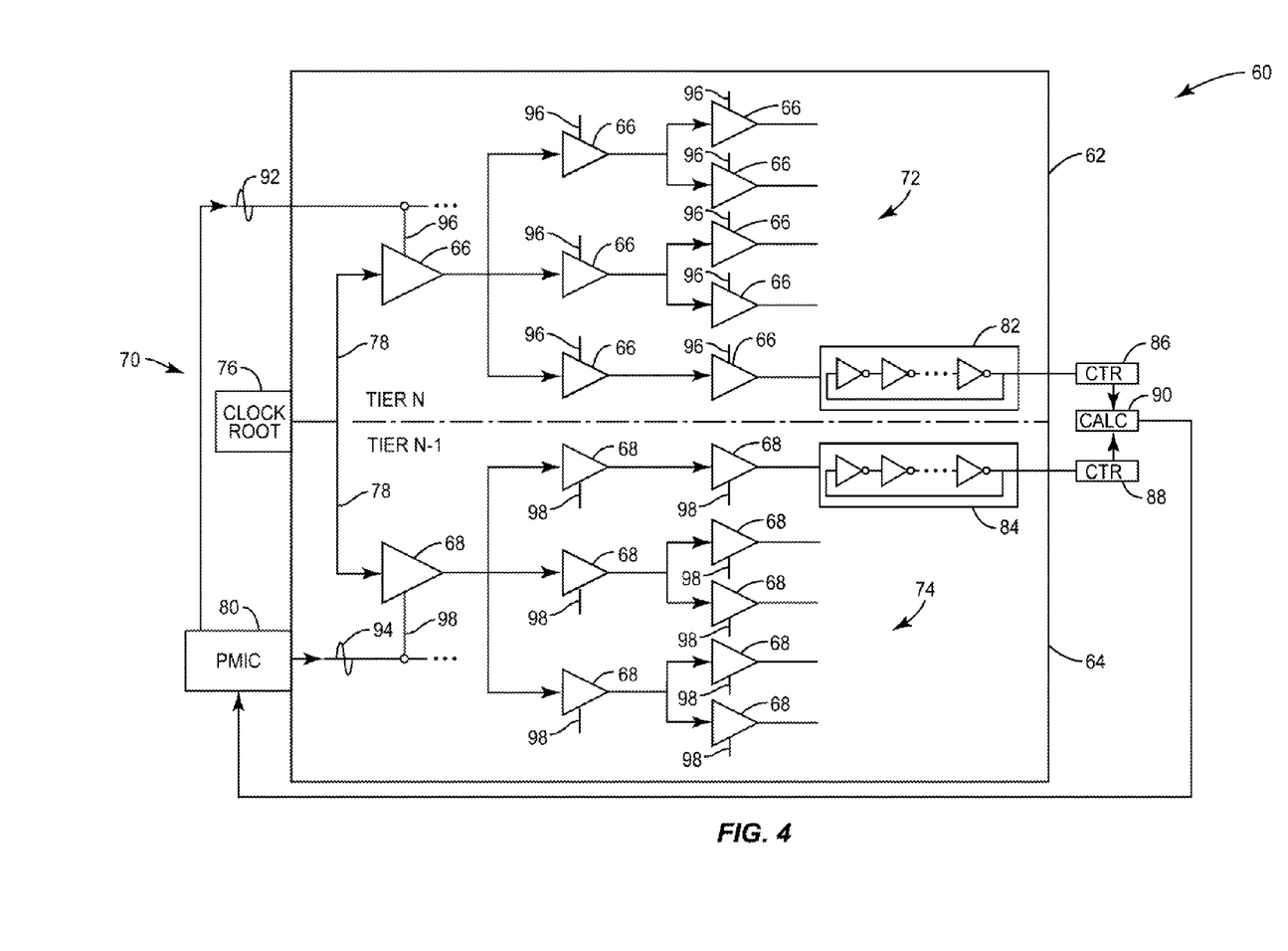
FIG. 4 is a simplified block diagram of a 3DIC with a clock tree and sensors for detecting speed characteristics of tiers within the 3DIC and generating a feedback signal that helps control a compensation for variations between speed characteristics of the tiers.

An exemplary aspect of a 3DIC with clock skew compensation via adaptive body biasing is presented in FIG. 4. As noted above, this exemplary aspect is well suited for a monolithic 3DIC 10 as illustrated in FIG. 1, but is also applicable to a flip-chip style 3DIC and a die-to-die with TSV 3DIC as well as other forms of 3DIC. In this regard, a 3DIC 60 is illustrated having a first tier 62 and a second tier 64. It should be appreciated that there may be more than just two tiers in the 3DIC 60 and thus, generically, the first tier 62 is tier N and the second tier is tier N−1. The first tier 62 includes clock buffers 66, which may include n-type and p-type clock buffers. The second tier 64 includes clock buffers 68, which may also include n-type and p-type clock buffers. The clock buffers 66 and 68 together with other clocked elements form a chip wide clock tree 70. The chip wide clock tree 70 may further be conceptualized as a combination of tier clock trees 72 and 74. That is, the tier clock tree 72 forms a first portion of the chip wide clock tree 70, and the tier clock tree 74 forms a second portion of the chip wide clock tree 70. The chip wide clock tree 70 has a clock root 76 that generates a clock signal. The clock root 76 may be on either the first tier 62 or the second tier 64, and may pass the clock signal to other tiers through a MIV or TSV (generally via 78).

With continued reference to FIG. 4, the 3DIC 60 is associated with a power management integrated circuit (PMIC) 80. In an exemplary aspect, the PMIC 80 is part of the 3DIC 60 (e.g., positioned on the second tier 64). In an alternate exemplary aspect, the PMIC 80 is distinct from, but communicatively coupled to, the 3DIC 60 through an appropriate communications interface (not shown).

With continued reference to FIG. 4, the first tier 62 includes a first sensor 82. In an exemplary aspect, the first sensor 82 is a ring oscillator. The second tier 64 includes a second sensor 84. In an exemplary aspect, the second sensor 84 is a ring oscillator. The first sensor 82 measures a first speed characteristic for the first tier 62, and the second sensor 84 measures a second speed characteristic for the second tier 64. In an exemplary aspect (not illustrated), the sensors 82, 84 report the measured speed characteristics directly to the PMIC 80 (i.e., the output of the sensors 82, 84 are provided to the PMIC 80). The PMIC 80 issues back body bias control signals to help reduce the impact of the difference between the speed characteristics as further explained below. In an exemplary aspect, where the first sensor 82 and the second sensor 84 are ring oscillators that generate respective counts that are tracked by a first counter (CTR) 86 and a second CTR 88, respectively. The first CTR 86 provides its count to a calculator (CALC) 90. The second CTR 88 also provides its count to the calculator 90. The calculator 90 determines a difference in count numbers between the two counters 86 and 88. The tier 62 or 64 that has the higher count is considered a faster tier. Such differences may be by design or as an unintended consequence of process variations. In either event, the calculator 90 may report the difference to the PMIC 80 or otherwise provide an output to the PMIC 80. It should be appreciated that the output of the calculator 90 is based on the output of the sensors 82, 84. If the PMIC 80 is part of the 3DIC 60, then the reporting may be through a bus (not labeled) within the 3DIC 60. If the PMIC 80 is external to the 3DIC 60, the calculator 90 may provide the reporting through an external bus along with appropriate communications interfaces (not shown). While only two sensors 82 and 84 are illustrated, it should be appreciated that each tier (or die) may have multiple sensors to assess speed characteristics more accurately. In an exemplary aspect, a single die may have a top sensor that senses in the top half of the die while a bottom sensor senses in the bottom half of the die.

With continued reference to FIG. 4, based on the measured speed characteristics, the PMIC 80 may issue a first signal 92 to the first tier 62 and a second signal 94 to the second tier 64. The signals 92 and 94 are routed to skew compensators for the clock buffers 66 and 68 through on-chip bias routes 96 and 98, respectively. In an exemplary aspect, the skew compensators are the back body biasing elements (illustrated and explained below with reference to FIG. 6) of the n-type and p-type clock buffers in the tier. Non-clock buffers are not adjusted by such back body biasing. Adjusting the back body bias in this fashion changes the threshold voltage of the clock buffer, which in turn changes its speed. A forward back body bias may be applied to the n-type and p-type clock buffers on a slow tier and a reverse back body bias may be applied to the n-type and p-type clock buffers on a fast tier. By making a slow portion of the clock tree faster and the fast portion slower, the difference in arrival time is reduced. If all the clock buffers on a particular tier are so adjusted, the net result is that clock skew between the tiers is reduced. While it is possible that only a single adjustment is made (e.g., speed up only the slow tier or slow down only the fast tier), in practice each tier will be adjusted in this fashion. By way of example, an IC that has a forty-five (45) nanometer (nm) node scale, an expected bias might be in the ±300 millivolt range with 50 millivolt step increments. In this regard, the 3DIC 60 may be integrated into a semiconductor die having various node scales (e.g., 45 nm).

Figure 5:
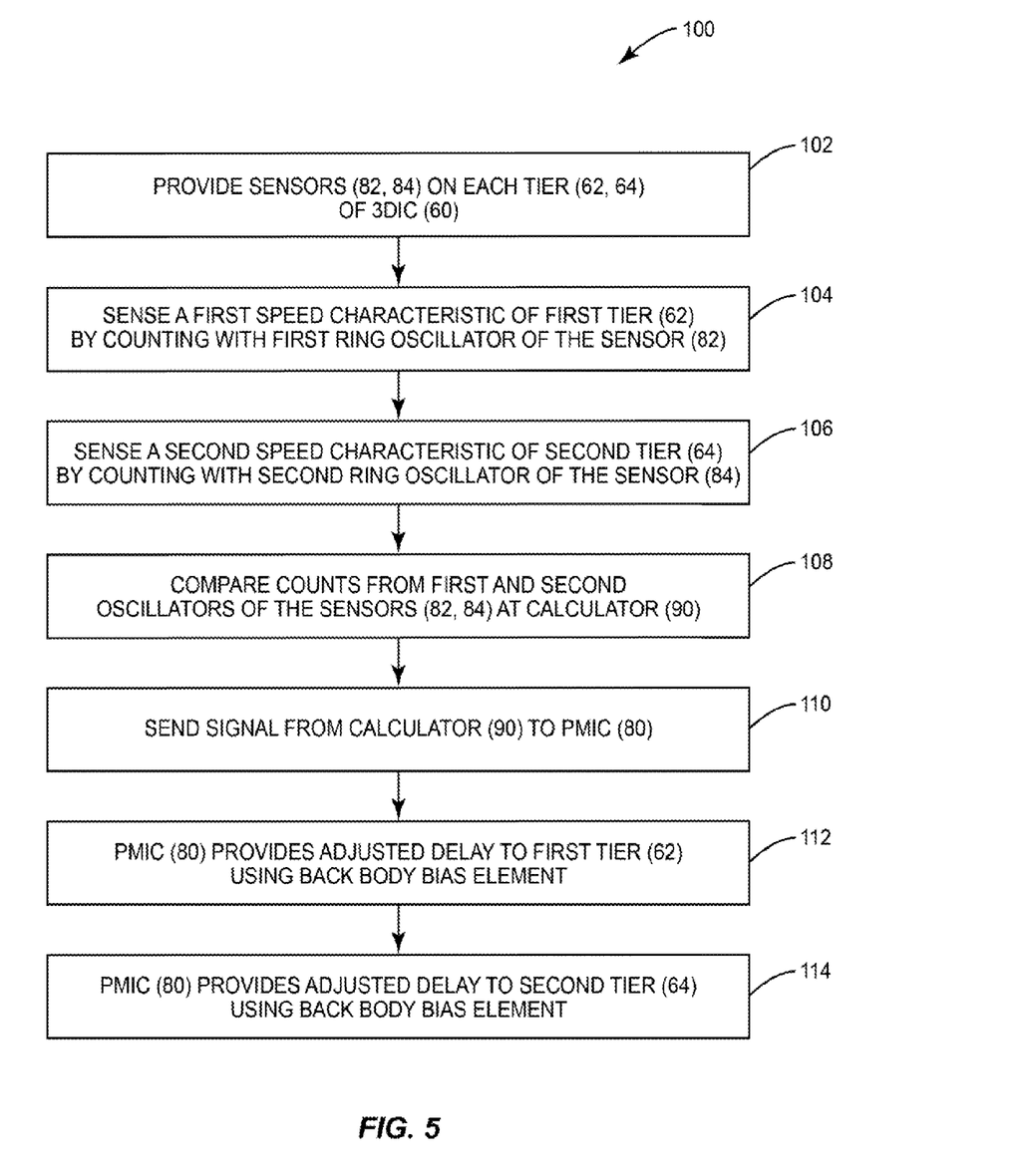
FIG. 5 is a flowchart of an exemplary process for speed characteristic compensation in the 3DIC of FIG. 4.

A flowchart of clock skew compensation with adaptive body biasing in the 3DIC 60 of FIG. 4 is presented as a process 100 in FIG. 5. The process 100 starts by providing sensors 82, 84 on the first tier 62 and the second tier 64 of the 3DIC 60 (block 102). The process 100 continues by sensing a first speed characteristic of the first tier 62 by counting with the first ring oscillator of the sensor 82 (block 104). Likewise, the process 100 senses a second speed characteristic of the second tier 64 by counting with the second ring oscillator of the sensor 84 (block 106). The process 100 continues by comparing counts from the first and second ring oscillators of the sensors 82, 84 at the calculator 90 (block 108). The calculator 90 sends a signal with information related to the counts (or the comparison thereof, which is also related to the counts) to the PMIC 80 (block 110). The PMIC 80 provides an adjusted delay to the n-type and p-type clock buffers of the first tier 62 using a back body bias element (block 112). The PMIC 80 provides an adjusted delay to the n-type and p-type clock buffers of the second tier 64 using a back body bias element (block 114).

As noted above, by adjusting the back body bias of the clock buffers, but not the non-clocked elements of the 3DIC 60, the voltage threshold may be adjusted, which in turn changes how quickly the clock buffers turn on or turn off. By changing the speed with which such changes are made, the effective speed of the tier is modified. By adjusting the tiers appropriately (i.e., making the slow tiers fast and the fast tiers slow), the clock skew between tiers may be minimized, which results in better operation of the 3DIC 60.

It should further be appreciated that body biasing and clock skew correction according to exemplary aspects of the present disclosure may occur every time there is a reset or power up of the 3DIC 60. At such reset or power up, the sensors 82 and 84 report the sensed delay to the PMIC 80 and there is a recalculation of speed characteristics along with a determination of appropriate body biasing voltage levels. Such repeated sensing, calculating, and determining may help reduce variation resulting from circuit aging.

Figure 6:
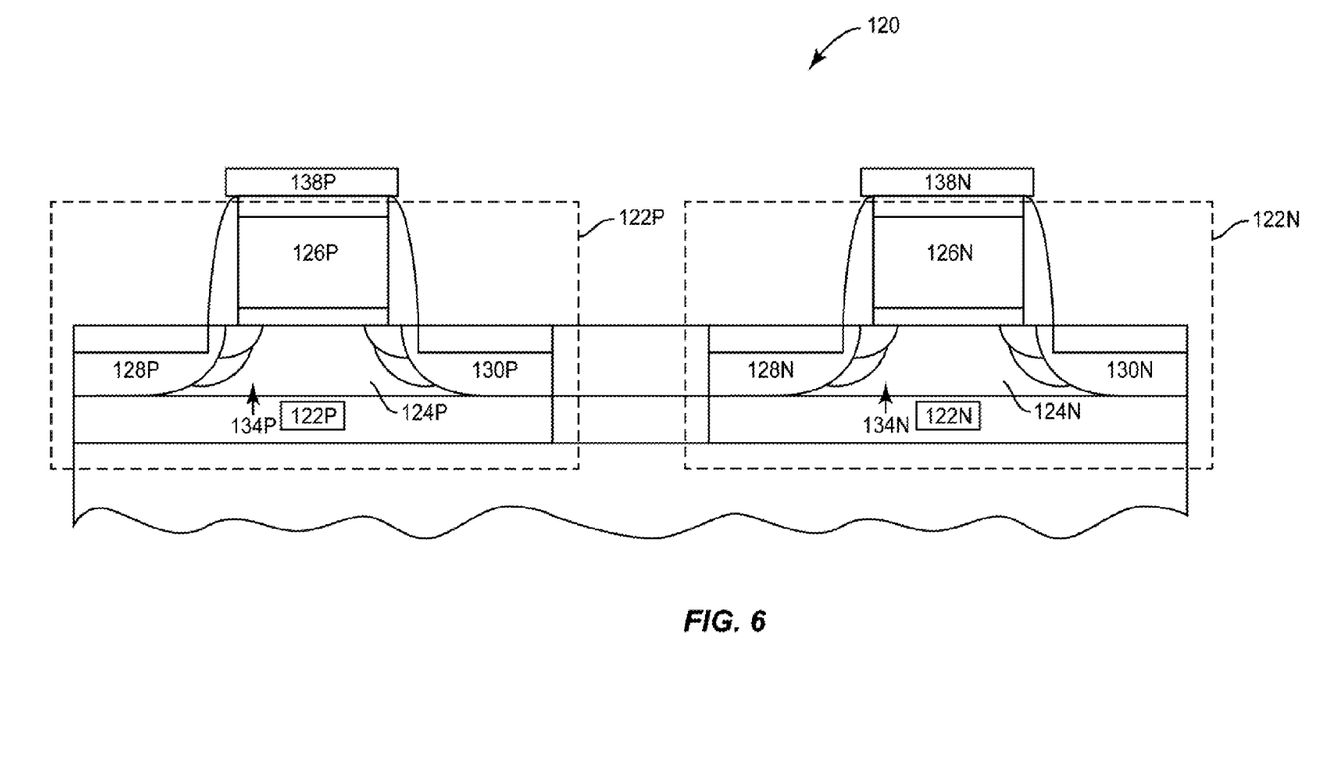
FIG. 6 is a cross-sectional view diagram of an exemplary silicon-on-insulator (SOI) complementary metal oxide semiconductor (CMOS) cell circuit employing a p-type metal oxide semiconductor (PMOS) gate back-bias rail and an n-type metal oxide semiconductor (NMOS) gate back-bias rail, each configured to provide a bias voltage to a corresponding PMOS or NMOS channel region so as to adjust a threshold voltage ($V_t$) of a PMOS transistor and a $V_t$ of an NMOS transistor, respectively.
Figure 7:
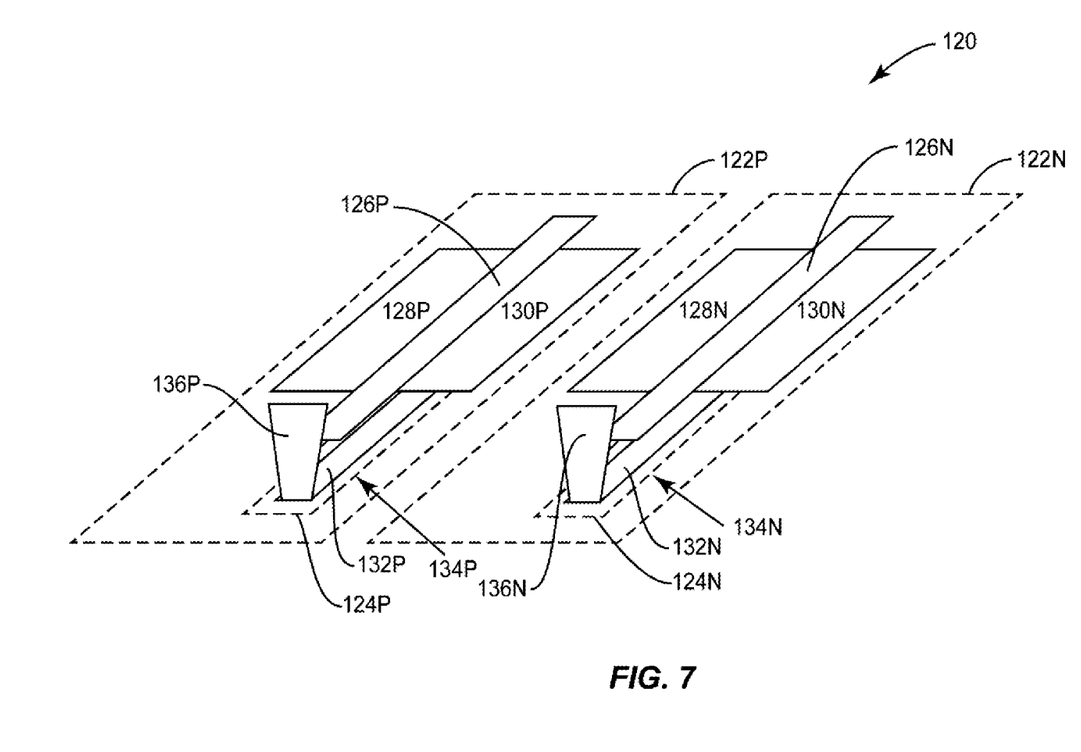
FIG. 7 is a perspective view diagram of the exemplary SOI CMOS cell circuit in FIG. 6 employing the PMOS gate back-bias rail and the NMOS gate back-bias rail, each configured to provide the bias voltage to the corresponding PMOS or NMOS channel region so as to adjust the $V_t$ of the PMOS transistor and the $V_t$ of the NMOS transistor, respectively.

To assist the interested reader with respect to back body biasing, the present disclosure provides a discussion about back body biasing with reference to FIGS. 6 and 7. For even more information about back body biasing techniques, the interested reader is referred to U.S. patent application Ser. No. 14/272,981, filed May 8, 2014, which is herein incorporated by reference in its entirety.

In this regard, FIG. 6 illustrates a cross-sectional view diagram of an exemplary SOI CMOS cell circuit 120 employing gate back-bias rails. FIG. 7 illustrates a perspective view diagram of the SOI CMOS cell circuit 120 in FIG. 6. With reference to FIGS. 6 and 7, the SOI CMOS cell circuit 120 includes a PMOS transistor 122P associated with a PMOS channel region 124P. The PMOS transistor 122P has a corresponding gate 126P, source 128P, and drain 130P. The SOI CMOS cell circuit 120 also includes an NMOS transistor 122N associated with an NMOS channel region 124N. Similar to the PMOS transistor 122P, the NMOS transistor 122N has a corresponding gate 126N, source 128N, and drain 130N. A PMOS gate back-bias rail 132P is disposed adjacent to the PMOS channel region 124P. The PMOS gate back-bias rail 132P may be implemented with various materials, such as metal or polysilicon, as examples. The PMOS gate back-bias rail 132P is configured to apply a PMOS bias voltage 134P to the PMOS channel region 124P to adjust a threshold voltage $V_{t\text{-}PMOS}$ of the PMOS transistor 122P. Similarly, an NMOS gate back-bias rail 132N is disposed adjacent to the NMOS channel region 124N. The NMOS gate back-bias rail 132N may be implemented with various materials, such as metal or polysilicon, as examples. The NMOS gate back-bias rail 132N is configured to apply an NMOS bias voltage 134N to the NMOS channel region 124N to adjust a threshold voltage $V_{t\text{-}NMOS}$ of the NMOS transistor 122N. With particular reference to FIG. 6, the SOI CMOS cell circuit 120 also employs a PMOS supply rail 138P and an NMOS supply rail 138N configured to provide a supply voltage to the PMOS transistor 122P and the NMOS transistor 122N, respectively.

In this manner, employing the PMOS gate back-bias rail 132P and the NMOS gate back-bias rail 132N, the SOI CMOS cell circuit 120 may adjust the $V_{t\text{-}PMOS}$ of the PMOS transistor 122P and the $V_{t\text{-}NMOS}$ of the NMOS transistor 122N. Adjusting the $V_{t\text{-}PMOS}$ of the PMOS transistor 122P and the $V_{t\text{-}NMOS}$ of the NMOS transistor 122N may achieve a design timing target without the addition of timing closure elements. More specifically, increasing the $V_{t\text{-}PMOS}$ may cause the PMOS transistor 122P to operate at a lower speed, while decreasing the $V_{t\text{-}PMOS}$ may cause the PMOS transistor 122P to operate at a higher speed. Similarly, increasing the $V_{t\text{-}NMOS}$ may cause the NMOS transistor 122N to operate at a lower speed, while decreasing the $V_{t\text{-}NMOS}$ may cause the NMOS transistor 122N to operate at a higher speed. Thus, the timing of an IC employing the SOI CMOS cell circuit 120 may be adjusted by using the PMOS gate back-bias rail 132P and the NMOS gate back-bias rail 132N to adjust the timing of the PMOS transistor 122P and the NMOS transistor 122N, respectively, through voltage biasing. Adjusting the timing of an IC in this manner removes the need to insert timing closure elements into the IC, thus avoiding any corresponding increase in area and power consumption of the IC.

Further, as discussed above and as illustrated in FIGS. 6 and 7, the PMOS gate back-bias rail 132P and the NMOS gate back-bias rail 132N are provided as part of the SOI CMOS cell circuit 120. In particular, the PMOS gate back-bias rail 132P and the NMOS gate back-bias rail 132N are disposed adjacent to the PMOS channel region 124P and the NMOS channel region 124N.

With particular reference to FIG. 7, a tap 136P is included in the SOI CMOS cell circuit 120 to provide the PMOS bias voltage 134P to the PMOS gate back-bias rail 132P. Similarly, a tap 136N is also included in the SOI CMOS cell circuit 120 to provide the NMOS bias voltage 134N to the NMOS gate back-bias rail 132N. Employing the PMOS gate back-bias rail 132P and the NMOS gate back-bias rail 132N may also reduce the area of an IC employing the SOI CMOS cell circuit 120 by allowing smaller taps 136P, 136N to be used to provide the respective bias voltages 134P, 134N. In particular, by disposing the PMOS gate back-bias rail 132P in the PMOS channel region 124P, the PMOS bias voltage 134P is applied only to the PMOS channel region 124P. By disposing the NMOS gate back-bias rail 132N in the NMOS channel region 124N, the NMOS bias voltage 134N is applied only to the NMOS channel region 124N. Thus, the taps 136P, 136N used to provide the PMOS bias voltage 134P and the NMOS bias voltage 134N to the PMOS channel region 124P and the NMOS channel region 124N, respectively, may be smaller than taps used to provide bias voltages to an entire well region of a CMOS circuit using bulk technology. In other words, because the PMOS channel region 124P and the NMOS channel region 124N in the SOI CMOS cell circuit 120 are smaller in area as compared to a well region in bulk technology, the smaller taps 136P, 136N may be employed to distribute the respective bias voltages 134P, 134N to the PMOS channel region 124P and the NMOS channel region 124N. Therefore, by using the smaller taps 136P, 136N, the area of an IC employing the SOI CMOS cell circuit 120 may be reduced as opposed to using a bulk technology CMOS circuit.

As discussed above, the PMOS gate back-bias rail 132P and the NMOS gate back-bias rail 132N in the SOI CMOS cell circuit 120 in FIGS. 6 and 7 are configured to apply the respective bias voltages 134P, 134N so as to adjust a threshold voltage of only a single PMOS transistor 122P or NMOS transistor 122N, respectively. However, the PMOS gate back-bias rail 132P and the NMOS gate back-bias rail 132N may also be configured to apply each respective bias voltage 134P, 134N so as to adjust a threshold voltage of multiple transistors simultaneously.

The clock skew compensation with adaptive body biasing in 3DICs, according to aspects disclosed herein, may be provided in or integrated into any processor-based device. Examples, without limitation, include: a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 8:
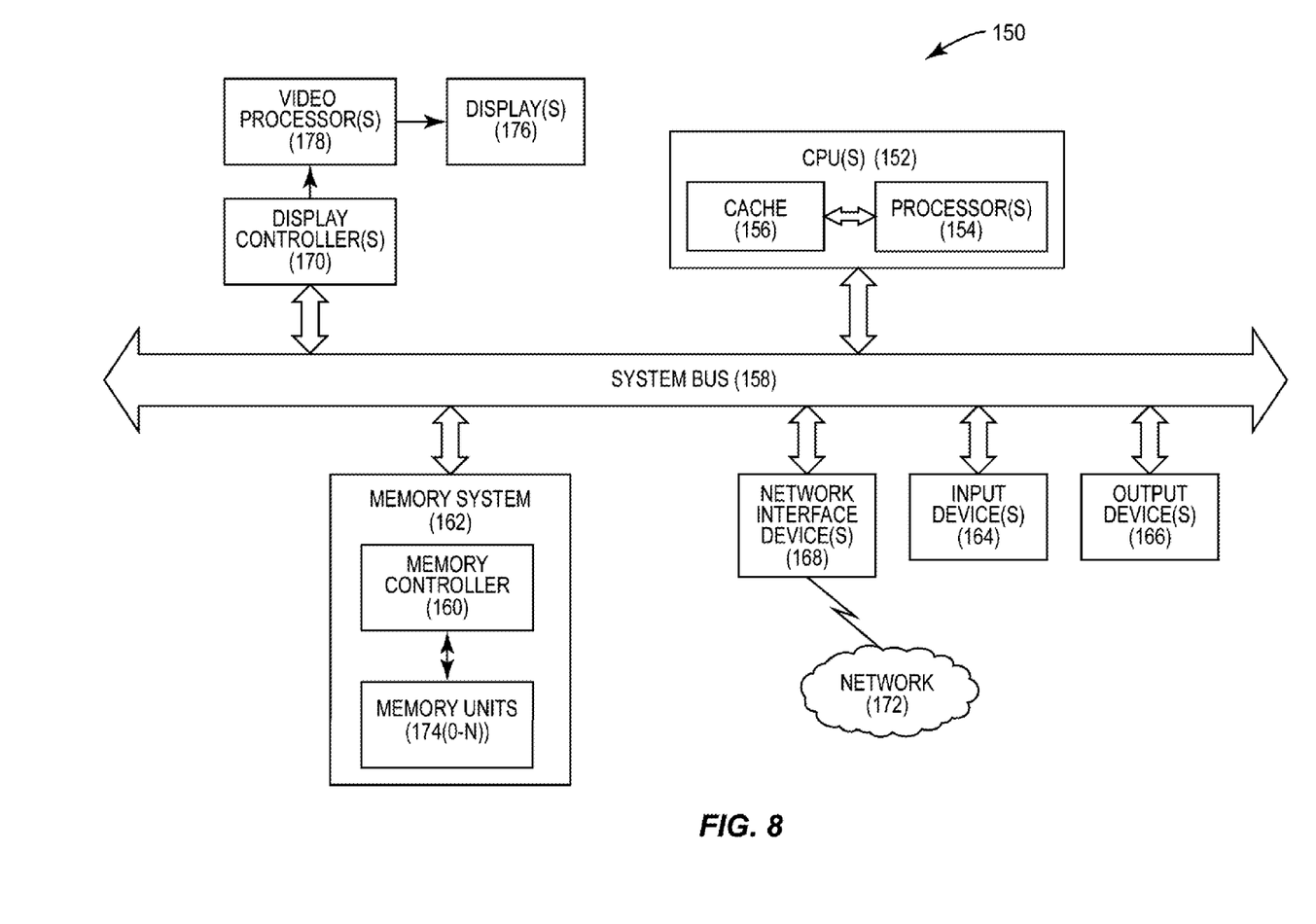
FIG. 8 is a block diagram of an exemplary processor-based system that can include the 3DIC of FIG. 1 or 4.

In this regard, FIG. 8 illustrates an example of a processor-based system 150 that can employ clock skew compensation with adaptive body biasing in the 3DIC 60 illustrated in FIG. 4. In this example, the processor-based system 150 includes one or more central processing units (CPUs) 152, each including one or more processors 154. The CPU(s) 152 may have cache memory 156 coupled to the processor(s) 154 for rapid access to temporarily stored data. The CPU(s) 152 is coupled to a system bus 158 and can intercouple devices included in the processor-based system 150. As is well known, the CPU(s) 152 communicates with these other devices by exchanging address, control, and data information over the system bus 158. For example, the CPU(s) 152 can communicate bus transaction requests to a memory controller 160.

Other devices can be connected to the system bus 158. As illustrated in FIG. 8, these devices can include a memory system 162, one or more input devices 164, one or more output devices 166, one or more network interface devices 168, and one or more display controllers 170, as examples. The input device(s) 164 can include any type of input device, including but not limited to: input keys, switches, voice processors, etc. The output device(s) 166 can include any type of output device, including but not limited to: audio, video, other visual indicators, etc. The network interface device(s) 168 can be any devices configured to allow exchange of data to and from a network 172. The network 172 can be any type of network, including but not limited to: a wired or wireless network, a private or public network, a local area network (LAN), a wireless local area network (WLAN), a wide area network (WAN), BLUETOOTH network, and the Internet. The network interface device(s) 168 can be configured to support any type of communications protocol desired. The memory system 162 can include one or more memory units 174(0-N).

The CPU(s) 152 may also be configured to access the display controller(s) 170 over the system bus 158 to control information sent to one or more displays 176. The display controller(s) 170 sends information to the display(s) 176 to be displayed via one or more video processors 178, which process the information to be displayed into a format suitable for the display(s) 176. The display(s) 176 can include any type of display, including but not limited to: a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A three-dimensional (3D) integrated circuit (IC) (3DIC) comprising:
   a first tier having a first speed characteristic, the first tier comprising:
      one or more first clock buffers served by a first portion of a clock tree;
      a first sensor configured to detect the first speed characteristic for both n-type and p-type clock buffers in the first tier and generate a first output indicative of the first speed characteristic; and
      a first skew compensator configured to provide a first adjusted delay for at least one of the one or more first clock buffers based on the first output indicative of the first speed characteristic and not adjusting non-clock buffers in the first tier; and a second tier having a second speed characteristic, the second tier comprising:
one or more second clock buffers served by a second portion of the clock tree;
a second sensor configured to detect the second speed characteristic for both n-type and p-type clock buffers in the second tier and generate a second output indicative of the second speed characteristic; and
a second skew compensator configured to provide a second adjusted delay for at least one of the one or more second clock buffers based on the second output indicative of the second speed characteristic and not adjusting non-clock buffers in the second tier.

2. The 3DIC of claim 1, wherein the first and second sensors are ring oscillators.

3. The 3DIC of claim 1, wherein the first output indicative of the first speed characteristic is a first count and the second output indicative of the second speed characteristic is a second count.

4. The 3DIC of claim 1, wherein the first sensor is configured to provide the first output to a power management integrated circuit (PMIC).

5. The 3DIC of claim 4, further comprising the PMIC.

6. The 3DIC of claim 4, further comprising a PMIC interface configured to allow the first sensor to provide the first output to the PMIC.

7. The 3DIC of claim 1, wherein the first skew compensator comprises a back body bias element.

8. The 3DIC of claim 7, wherein the first skew compensator is configured to provide a forward back body bias to increase speed through the one or more first clock buffers of the first portion of the clock tree.

9. The 3DIC of claim 7, wherein the first skew compensator is configured to provide a reverse back body bias to decrease speed through the one or more first clock buffers of the first portion of the clock tree.

10. The 3DIC of claim 1 integrated into a semiconductor die.

11. The 3DIC of claim 1 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

12. A three-dimensional (3D) integrated circuit (IC) (3DIC) comprising:
a first tier having a first speed characteristic, the first tier comprising:
one or more first clock buffers served by a first portion of a clock tree;
a first means for sensing configured to detect the first speed characteristic for both n-type and p-type clock buffers in the first tier and generate a first output indicative of the first speed characteristic; and
a first means for compensating skew configured to provide a first adjusted delay for at least one of the one or more first clock buffers based on the first output indicative of the first speed characteristic and not adjusting non-clock buffers in the first tier; and a second tier having a second speed characteristic, the second tier comprising:
one or more second clock buffers served by a second portion of the clock tree;
a second means for sensing configured to detect the second speed characteristic for both n-type and p-type clock buffers in the second tier and generate a second output indicative of the second speed characteristic; and
a second means for compensating skew configured to provide a second adjusted delay for at least one of the one or more second clock buffers based on the second output indicative of the second speed characteristic and not adjusting non-clock buffers in the second tier.

13. A method comprising:
sensing a first speed characteristic for both n-type and p-type first clock buffers on a first tier of a three-dimensional (3D) integrated circuit (IC)(3DIC);
generating a first output indicative of the first speed characteristic;
providing a first adjusted delay for at least one of the n-type and p-type first clock buffers based on the first output and not adjusting non-clock buffers in the first tier;
sensing a second speed characteristic for both n-type and p-type second clock buffers on a second tier of the 3DIC;
generating a second output indicative of the second speed characteristic; and
providing a second adjusted delay for at least one of the n-type and p-type second clock buffers based on the second output and not adjusting non-clock buffers in the second tier.

14. The method of claim 13, wherein sensing the first speed characteristic comprises sensing the first speed characteristic with a first ring oscillator.

15. The method of claim 14, wherein sensing the second speed characteristic comprises sensing the second speed characteristic with a second ring oscillator.

16. The method of claim 15, wherein generating the first output comprises generating a first count with the first ring oscillator and wherein generating the second output comprises generating a second count with the second ring oscillator.

17. The method of claim 16, further comprising comparing the first count to the second count using a calculator.

18. The method of claim 17, further comprising sending a signal related to the first count from the calculator to a power management integrated circuit (PMIC).

19. The method of claim 13, further comprising providing information related to the first output to a power management integratd circuit (PMIC).

20. The method of claim 19, wherein providing the information related to the first output to the PMIC comprises providing the first output to the PMIC on the 3DIC.

21. The method of claim 19, wherein providing the information related to the first output to the PMIC comprises sending a signal to the PMIC outside the 3DIC.

22. The method of claim 13, wherein providing the first adjusted delay comprises using a back body bias element.

23. The method of claim 13, wherein providing the first adjusted delay comprises using a forward back body bias.

24. The method of claim 13, wherein providing the first adjusted delay comprises using a reverse back body bias.

25. A three-dimensional (3D) integrated circuit (IC) (3DIC) comprising:
a first tier having a first speed characteristic, comprising:
one or more first clock buffers served by a first portion of a clock tree;

a first sensor configured to detect the first speed characteristic for both n-type and p-type clock buffers in the first tier and generate a first output indicative of the first speed characteristic; and a first skew compensator configured to provide a first adjusted delay for at least one of the one or more first clock buffers based on the first output indicative of the first speed characteristic and not adjusting non-clock buffers in the first tier; and a second tier having a second speed characteristic, comprising:

one or more second clock buffers served by a second portion of the clock tree;

a second sensor configured to detect the second speed characteristic for both n-type and p-type clock buffers in the second tier and generate a second output indicative of the second speed characteristic; and a second skew compensator configured to provide a second adjusted delay for at least one of the one or more second clock buffers based on the second output indicative of the second speed characteristic.

\* \* \* \* \*